(12) United States Patent
Imai

(10) Patent No.: US 6,821,885 B2
(45) Date of Patent: Nov. 23, 2004

(54) SEMICONDUCTOR DEVICE AND METHOD FOR MANUFACTURING THE SAME

(75) Inventor: Shinichi Imai, Hirakata (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/032,562

(22) Filed: Jan. 2, 2002

(65) Prior Publication Data

US 2002/0089059 A1 Jul. 11, 2002

(30) Foreign Application Priority Data

Jan. 10, 2001 (JP) .................................... 2001-002965

(51) Int. Cl.$^7$ ................................... H01L 21/4763
(52) U.S. Cl. .................. 438/640; 438/618; 438/631; 438/637; 438/666; 438/668
(58) Field of Search .................. 478/618, 622, 478/631, 637, 640, 666, 668, 672, 677

(56) References Cited

U.S. PATENT DOCUMENTS 5,091,339 A * 2/1992 Carey ........................... 216/18
5,219,787 A * 6/1993 Carey et al. ................. 438/637
5,403,779 A * 4/1995 Joshi et al. .................. 438/634
6,235,633 B1 * 5/2001 Jang ........................... 438/675

* cited by examiner

Primary Examiner—Tom Thomas
Assistant Examiner—N. Drew Richards
(74) Attorney, Agent, or Firm—Donald R. Studbaker; Nixon Peabody, LLP

(57) ABSTRACT

A method for manufacturing a semiconductor device of the present invention includes the steps of: (a) depositing an interlayer insulator film on a substrate including a plurality of conductive layers; (b) forming a plurality of contact holes running through the interlayer insulator film to reach respective ones of the plurality of conductive layers, each of the contact holes having a tapered portion at an upper end thereof; (c) depositing a conductive material film on the interlayer insulator film so as to fill the plurality of contact holes; (d) removing the conductive material film until a surface of the interlayer insulator film is exposed so as to form a plurality of plugs made of the conductive material film filling the plurality of contact holes; and (e) removing a portion of the interlayer insulator film, which has been exposed in the step (d), so as to remove the tapered portions.

2 Claims, 10 Drawing Sheets

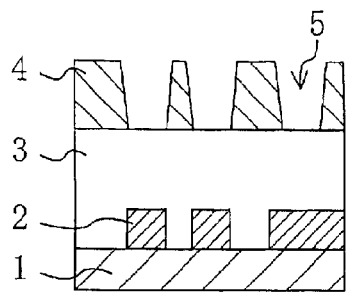 FIG. 4A 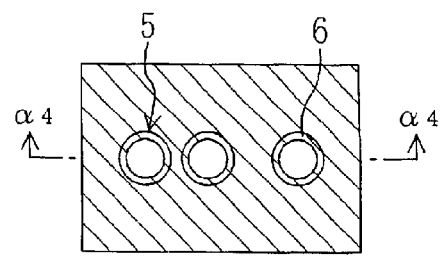
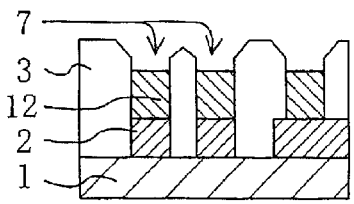 FIG. 4B 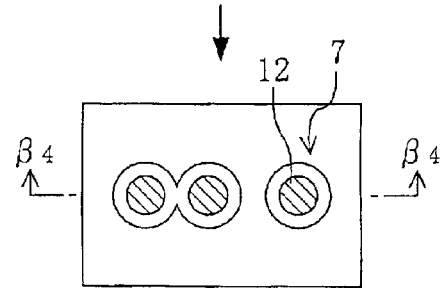
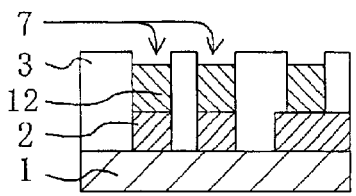 FIG. 4C 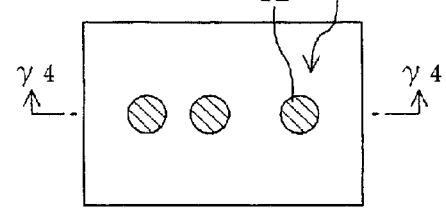
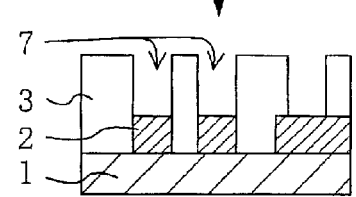 FIG. 4D 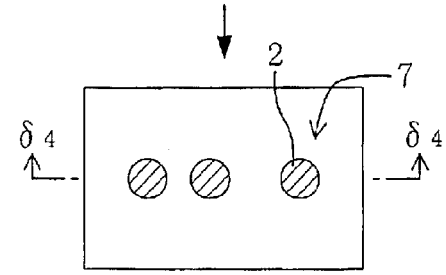

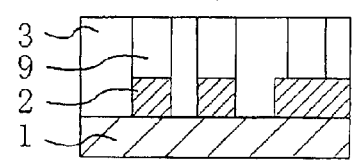 FIG. 4F 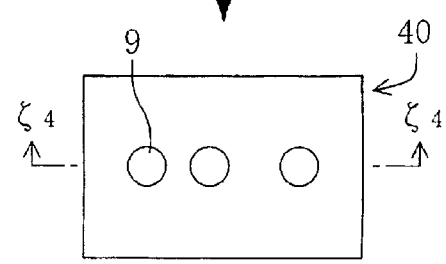

SEMICONDUCTOR DEVICE AND METHOD FOR MANUFACTURING THE SAME

BACKGROUND OF THE INVENTION

The present invention relates to a semiconductor device and a method for manufacturing the same, and more particularly to measures that should be taken along with the miniaturization of semiconductor devices.

In recent years, there has been a remarkable improvement in the degree of integration of semiconductor devices. As the degree of integration increases, the wiring pitch has been decreasing. As the wiring pitch decreases, there has been a decrease in the minimum width of the interlayer insulator film existing between adjacent ones of contact holes that are running through wiring layers (the width by which the contact holes are separated from each other). In other words, there has been a decrease in the width by which adjacent plugs (made of a conductive material film filling the contact holes so as to connect the wiring layers to one another) are separated from each other.

For example, in a device designed under a 0.18 $\mu$m design rule, the wiring pitch is 0.47 $\mu$m, and the diameter of a contact hole (plug) is 0.26 $\mu$m. Thus, the contact hole separation width (the plug separation width) is 0.21 $\mu$m. When manufacturing a semiconductor device having such a small contact hole separation width, it is necessary to form a large number of closely arranged contact holes, which requires an etching mask having a large number of closely arranged contact hole patterns corresponding respectively to the contact holes. However, when a resist film is patterned to produce an etching mask, it is likely that each contact hole pattern is shaped so that an upper portion thereof is larger than a lower portion thereof. In other words, the contact hole pattern is likely to have a tapered cross section. For example, where a contact hole having a diameter of 0.26 $\mu$m is formed using a resist film having a thickness of 0.7 $\mu$m, if the upper portion of the contact hole pattern is enlarged by 10% (0.026 $\mu$m) in diameter during the resist film patterning process, the side surface of the contact hole pattern has an inclination angle (taper angle) of 89° with respect to the substrate surface.

Such an contact hole pattern having a tapered cross section is formed when, for example, the focus value is shifted from the intended median during a patterning process in the lithography step. When such an contact hole pattern having a tapered cross section is formed, the thickness of the resist film may decrease from the thickness of the resist film as applied in locations between adjacent contact hole patterns, whereby the adjacent contact hole patterns are connected to each other via the upper portions thereof.

When a contact hole is formed by etching an interlayer insulator film using such a resist film as an etching mask, the contact hole is likely to be shaped so that an upper portion thereof is larger than a lower portion. In other words, a contact hole whose upper portion has a tapered cross section is likely to be formed.

FIG. 11A to FIG. 11D are cross-sectional views and top views schematically illustrating a conventional method for manufacturing a semiconductor device. The cross-sectional views of FIG. 11A, FIG. 11B and FIG. 11D are taken along lines $\alpha 11$—$\alpha 11$, $\beta 11$—$\beta 11$ and $\delta 11$—$\delta 11$, respectively, which are shown in the corresponding top views.

First, in the step of FIG. 11A, impurity diffusion regions (not shown) are formed in a semiconductor substrate 1 to form switching transistors (not shown), etc. Then, a wiring layer 2 is formed on the semiconductor substrate 1, and an interlayer insulator film 3 is formed thereon.

Then, the interlayer insulator film 3 is flattened by a chemical mechanical polishing (hereinafter referred to as "CMP") method, and a resist film 4 is formed thereon. Then, contact hole patterns 5 corresponding respectively to contact holes are formed in the resist film 4 by photolithography. Ideally, each contact hole pattern 5 has a cross section such that a side wall 6 thereof is perpendicular to the substrate surface. In practice, however, the cross section of the contact hole pattern 5 is likely to be slightly tapered in the forward direction as described above.

Then, in the step of FIG. 11B, contact holes 7 are formed by etching the interlayer insulator film 3 using the resist film 4 as an etching mask. After the etching process, an upper portion of each contact hole 7 is tapered.

Then, in the step of FIG. 11C, a conductive material film 8 (e.g., polysilicon, tungsten, copper, etc.) is deposited on the substrate.

Then, in the step of FIG. 11D, the conductive material film 8 is flattened by a CMP method until the surface of the interlayer insulator film 3 is exposed, thus forming plugs 9 which are made of the conductive material film 8 filling the contact holes 7.

A semiconductor device 100 is produced through these steps.

However, with the conventional method for manufacturing a semiconductor device as described above, adjacent contact holes may be connected to each other via the upper portions thereof, as illustrated in the plan view of FIG. 11B. Therefore, adjacent plugs are likely to be connected to each other via the upper portions thereof, as illustrated in the plan view of FIG. 11D, thereby causing a short-circuit between the plugs.

SUMMARY OF THE INVENTION

The present invention has been made to solve the problem described above, and has an object to provide a semiconductor device having a small wiring pitch and a method for manufacturing the same.

A method for manufacturing a semiconductor device of the present invention includes the steps of: (a) depositing an interlayer insulator film on a substrate including a plurality of conductive layers; (b) forming a plurality of contact holes running through the interlayer insulator film to reach respective ones of the plurality of conductive layers, each of the contact holes having a tapered portion (faceting portion) at an upper end thereof; (c) depositing a conductive material film on the interlayer insulator film so as to fill the plurality of contact holes; (d) removing the conductive material film until a surface of the interlayer insulator film is exposed so as to form a plurality of plugs made of the conductive material film filling the plurality of contact holes; and (e) removing a portion of the interlayer insulator film, which has been exposed in the step (d), so as to remove the tapered portions.

In this way, even if adjacent contact holes are connected to each other via the upper portions thereof in the step (b) of forming the plurality of contact holes, it is possible to prevent the plugs filling the contact holes from being short-circuited to each other.

Another method for manufacturing a semiconductor device of the present invention includes the steps of: (a) depositing an interlayer insulator film on a substrate including a plurality of conductive layers; (b) depositing a first conductive material film on the substrate; (c) forming a plurality of contact holes running through the first conductive material film and the interlayer insulator film to reach respective ones of the plurality of conductive layers; (d) depositing a second conductive material film on the first conductive material film so as to fill the plurality of contact holes; and (e) removing the second conductive material film and the first conductive material film until a surface of the interlayer insulator film is exposed so as to form a plurality of plugs which are made of the conductive material film filling the plurality of contact holes.

In this way, even if adjacent contact holes are connected to each other via the upper portions thereof in the step of forming the contact holes, it is possible to prevent the plugs filling the contact holes from being short-circuited to each other. Particularly, adjacent contact holes can be separated from each other only by flattening the first and second conductive material films. Thus, the interlayer insulator film is not flattened by a method that is adjusted to conditions according to the first and second conductive material films. Therefore, the method is particularly suitable for cases where flattening the interlayer insulator film by a method that is adjusted to conditions according to the first and second conductive material films may cause problems.

Still another method for manufacturing a semiconductor device of the present invention includes the steps of: (a) depositing an interlayer insulator film on a substrate including a plurality of conductive layers; (b) forming a plurality of contact holes running through the interlayer insulator film to reach respective ones of the plurality of conductive layers, each of the contact holes having a tapered portion at an upper end thereof; (c) removing a portion of the interlayer insulator film so as to remove the tapered portions; (d) depositing a conductive material film on the interlayer insulator film so as to fill the plurality of contact holes; and (e) removing the conductive material film until a surface of the interlayer insulator film is exposed so as to form a plurality of plugs which are made of the conductive material film filling the plurality of contact holes.

A portion of the interlayer insulator film is removed so as to remove the tapered portions, thereby separating adjacent contact holes from each other, before depositing the conductive material film. Therefore, it is possible to prevent the plugs filling the contact holes from being short-circuited to each other.

In the step (c), the tapered portions may be removed by etching or chemical mechanical polishing.

Still another method for manufacturing a semiconductor device of the present invention includes the steps of: (a) depositing an interlayer insulator film on a substrate including a plurality of conductive layers; (b) forming a plurality of contact holes running through the interlayer insulator film to reach respective ones of the plurality of conductive layers, each of the contact holes having a tapered portion at an upper end thereof; (c) forming an organic material film so as to fill the plurality of contact holes; (d) removing a portion of the interlayer insulator film so as to remove the tapered portions; (e) removing the organic material film; (f) depositing a conductive material film on the interlayer insulator film so as to fill the plurality of contact holes; (g) removing the conductive material film until a surface of the interlayer insulator film is exposed so as to form a plurality of plugs which are made of the conductive material film filling the plurality of contact holes.

A portion of the interlayer insulator film is removed so as to remove the tapered portions, thereby separating adjacent contact holes from each other, before depositing the conductive material film. Therefore, it is possible to prevent the plugs filling the contact holes from being short-circuited to each other. Particularly, when the entire surface of the substrate is flattened by a CMP method, a slurry may remain inside the contact holes. Removal of the slurry may be difficult when the contact hole has a high aspect ratio. However, according to the present invention, the slurry used in the CMP method will not remain in the contact holes because the contact holes are filled with the organic material film. Thus, it is possible to suppress/prevent a slurry from existing, as an impurity, in the conductive material film when forming the plugs.

In the step (d), the tapered portions may be removed by etching or chemical mechanical polishing.

Still another method for manufacturing a semiconductor device of the present invention includes the steps of: (a) depositing an interlayer insulator film on a substrate including a plurality of conductive layers; (b) applying a resist film on the interlayer insulator film and patterning the resist film so as to from an etching mask having a plurality of contact hole patterns therein; (c) performing an etching process using the etching mask so as to form a plurality of contact holes running through the interlayer insulator film to reach respective ones of the plurality of conductive layers; (d) depositing a conductive material film on the interlayer insulator film so as to fill the plurality of contact holes; and (e) removing the conductive material film until a surface of the interlayer insulator film is exposed so as to form a plurality of plugs which are made of the conductive material film filling the plurality of contact holes, wherein in the step (b), the resist film is applied to a thickness such that upper ends of the plurality of contact holes will not be tapered in the step (c).

According to the method, the resist film is applied to a thickness such that the upper ends of the plurality of contact holes will not be tapered in the step (c). Thus, adjacent contact holes are not connected via the upper portions thereof in the step of forming the contact holes by etching. In this way, it is possible to avoid an additional step of separating adjacent contact holes that have been connected to each other via the upper portions thereof, which would otherwise be required before or after forming a conductive material film so as to fill the contact holes. Therefore, it is possible to suppress/prevent a short-circuit between plugs while reducing the manufacturing cost.

Preferably, in the step (c), a ratio of an etch rate for the interlayer insulator film with respect to an etch rate for the resist film located on a side wall of each of the contact holes is 3.5 or more.

A semiconductor device of the present invention includes: a substrate including a plurality of conductive layers; an interlayer insulator film provided on the substrate; and a plurality of plugs running through the interlayer insulator film to reach respective ones of the plurality of conductive layers, wherein any adjacent two of the plurality of plugs are separated from each other by the interlayer insulator film, and a minimum width of the interlayer insulator film existing between two adjacent plugs is 0.30 $\mu$m or less.

In this way, it is possible to obtain a semiconductor device in which a short-circuit between plugs is suppressed/prevented.

BRIEF DESCRIPTION OF THE DRAWINGS

FIG. 4A to FIG. 4F are cross-sectional views and top views schematically illustrating a method for manufacturing a semiconductor device 40 of Embodiment 4 of the present invention, wherein the cross-sectional views of FIG. 4A, FIG. 4B, FIG. 4C, FIG. 4D and FIG. 4F are taken along lines α4—α4, β4—β4, γ4—γ4, δ4—δ4 and ζ4—ζ4, respectively, which are shown in the corresponding top views.

DESCRIPTION OF THE PREFERRED EMBODIMENTS

Figure 1A:
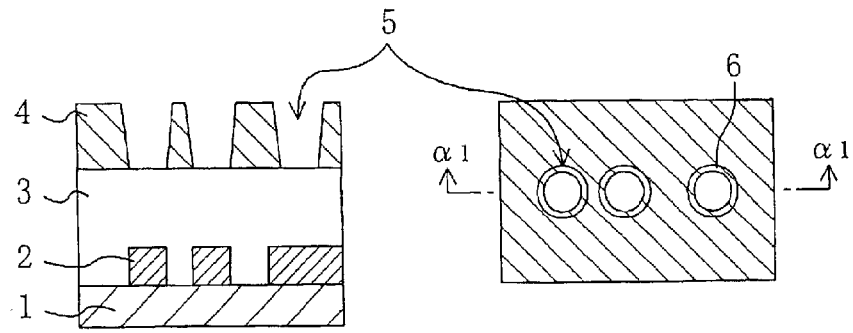
FIG. 1A to FIG. 1E are cross-sectional views and top views schematically illustrating a method for manufacturing a semiconductor device 10 of Embodiment 1 of the present invention, wherein the cross-sectional views of FIG. 1A, FIG. 1B, FIG. 1D and FIG. 1E are taken along lines α1—α1, β1—β1, δ1—δ1 and ε1—ε1, respectively, which are shown in the corresponding top views.

Various embodiments of the present invention will now be described with reference to the drawings. For the sake of simplicity, like reference numerals denote like elements throughout the figures.

Embodiment 1

FIG. 1A to FIG. 1E are cross-sectional views and top views schematically illustrating a method for manufacturing a semiconductor device 10 of Embodiment 1 of the present invention, wherein the cross-sectional views of FIG. 1A, FIG. 1B, FIG. 1D and FIG. 1E are taken along lines α1—α1, β1—β1, δ1—δ1 and ε1—ε1, respectively, which are shown in the corresponding top views.

First, in the step of FIG. 1A, impurity diffusion regions (not shown) are formed in a semiconductor substrate 1 to form switching transistors (not shown), etc. Then, a wiring layer 2 is formed on the semiconductor substrate 1. In the present embodiment, the wiring pitch of the wiring layer 2 is 0.47 μm.

Then, an interlayer insulator film 3 is formed on the semiconductor substrate 1. In the present embodiment, an oxide film is used as the interlayer insulator film 3. Then, the interlayer insulator film 3 is flattened by using a CMP method. Then, a resist film 4 is formed so as to cover the interlayer insulator film 3. Then, contact hole patterns 5 are formed in the resist film 4 by photolithography. The contact hole patterns 5 are formed so that a side wall 6 of each contact hole pattern 5 is tapered downwardly.

Figure 1B:
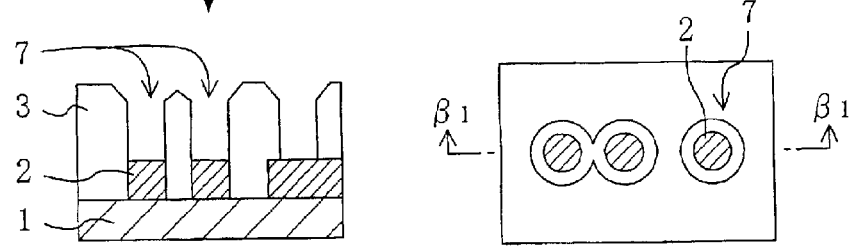

Then, in the step of FIG. 1B, the interlayer insulator film 3 is dry-etched using the resist film 4 having the contact hole patterns 5 therein as an etching mask so as to form contact holes 7 reaching the wiring layer 2 or the impurity diffusion regions (not shown). As described above, after the etching process, an upper portion of each contact hole 7 is likely to be tapered, as illustrated in the top view of FIG. 1B. Thus, adjacent contact holes 7 may be connected to each other via the upper portions thereof.

Figure 1C:
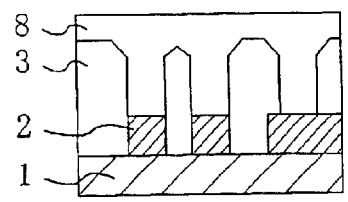

Then, in the step of FIG. 1C, a conductive material film 8 (e.g., polysilicon, a tungsten film, copper, etc.) is deposited on the substrate.

Figure 1D:
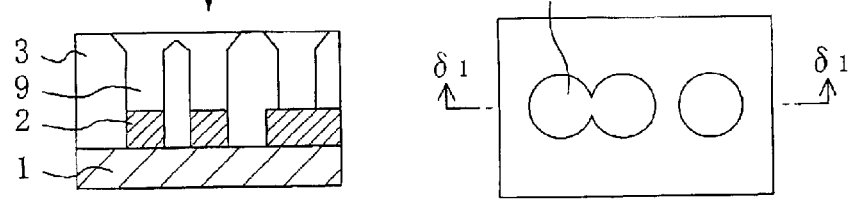

Then, in the step of FIG. 1D, the conductive material film 8 is flattened by a CMP method until the surface of the interlayer insulator film 3 is exposed, thus forming plugs 9 which are made of the conductive material film 8 filling the contact holes 7.

Figure 1E:
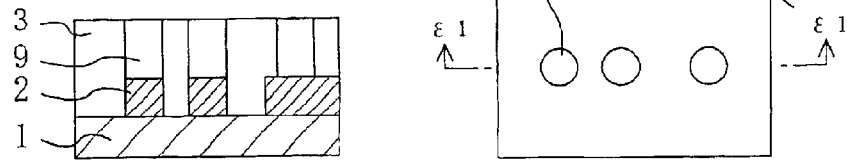

Then, in the step of FIG. 1E, a further polishing (overpolishing) process is performed by a CMP method so as to remove a portion of the interlayer insulator film 3 corresponding to the tapered upper portion of the contact hole 7. Thus, the upper portions of adjacent contact holes 7 are separated from each other.

The semiconductor device 10 is produced through these steps.

According to the present embodiment, even if adjacent contact holes 7 are connected to each other via the upper portions thereof when the contact holes 7 is formed while manufacturing the semiconductor device 10, it is possible to prevent the plugs 9 filling the contact holes 7 from being short-circuited to each other. The method of the present embodiment is advantageous in manufacturing a semiconductor device in which the minimum width of the interlayer insulator film existing between two adjacent plugs is 0.30 μm or less, and provides significant effects in manufacturing a semiconductor device in which the wiring pitch of the wiring layer 2 is 0.50 μm or less.

Embodiment 2

Figure 2A:
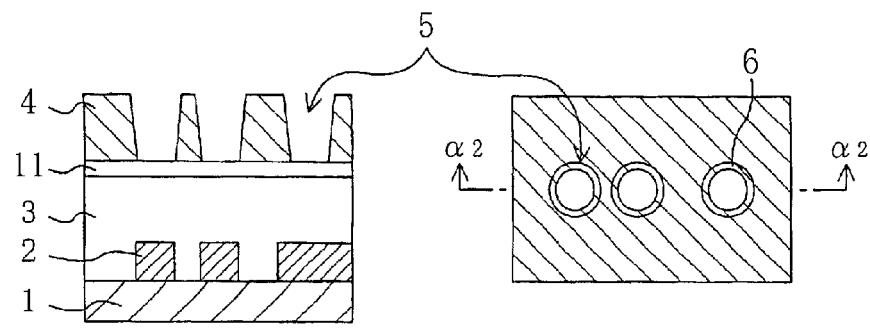
FIG. 2A to FIG. 2D are cross-sectional views and top views schematically illustrating a method for manufacturing a semiconductor device 20 of Embodiment 2 of the present invention, wherein the cross-sectional views of FIG. 2A, FIG. 2B and FIG. 2D are taken along lines α2—α2, β2—β2 and δ2—δ2, respectively, which are shown in the corresponding top views.
Figure 2B:
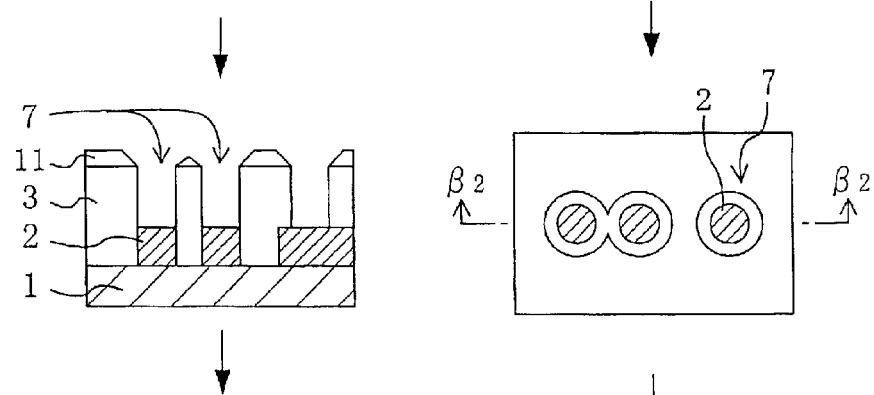
Figure 2C:
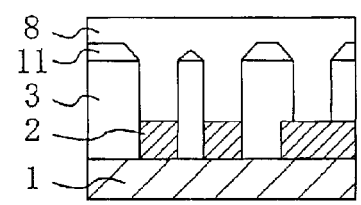
Figure 2D:
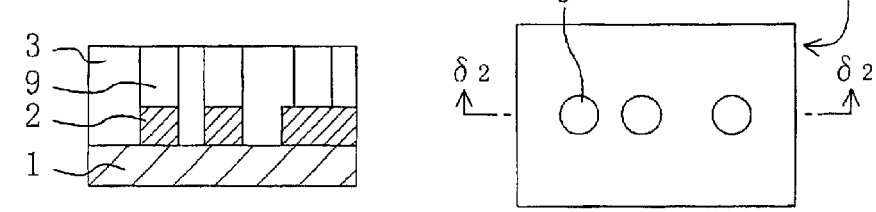

FIG. 2A to FIG. 2D are cross-sectional views and top views schematically illustrating a method for manufacturing a semiconductor device 20 of Embodiment 2 of the present invention, wherein the cross-sectional views of FIG. 2A, FIG. 2B and FIG. 2D are taken along lines α2—α2, β2—β2 and δ2—δ2, respectively, which are shown in the corresponding top views.

First, in the step of FIG. 2A, impurity diffusion regions (not shown) are formed in the semiconductor substrate 1 to form switching transistors (not shown), etc. Then, the wiring layer 2 is formed on the semiconductor substrate 1. In the present embodiment, the wiring pitch of the wiring layer 2 is 0.47 µm.

Then, the interlayer insulator film 3 is formed on the semiconductor substrate 1. In the present embodiment, an oxide film is used as the interlayer insulator film 3. Then, the interlayer insulator film 3 is flattened by using a CMP method. Then, a conductive material film 11 is formed so as to cover the interlayer insulator film 3, after which the resist film 4 is formed so as to cover the conductive material film 11. Then, the contact hole patterns 5 are formed in the resist film 4 by photolithography. The contact hole patterns 5 are formed so that the side wall 6 of each contact hole pattern 5 is tapered downwardly, as illustrated in FIG. 2A.

Then, in the step of FIG. 2B, using the resist film 4 having the contact hole patterns 5 therein as an etching mask, the conductive material film 11 is first etched in a plasma etching process using a plasma containing an active species therein and having fluorine or chlorine as its main component. Then, the interlayer insulator film 3 is dry-etched so as to form the contact holes 7 reaching the wiring layer 2 or the impurity diffusion regions (not shown). As described above, after the etching process, an upper portion of each contact hole 7, i.e., a portion corresponding to the conductive material film 11, is likely to be tapered, as illustrated in the top view of FIG. 2B. Thus, adjacent contact holes 7 may be connected to each other via the upper portions thereof.

Then, in the step of FIG. 2C, the conductive material film 8 is deposited on the substrate.

Then, in the step of FIG. 2D, a flattening process is performed by a CMP method. The flattening process by a CMP method is performed to remove the conductive material film 11 until the surface of the interlayer insulator film 3 is exposed, thus forming the plugs 9 which are made of the conductive material film 8.

The semiconductor device 20 is produced through these steps.

While tungsten is used as the conductive material films 8 and 11 in the present embodiment, polysilicon, copper, etc., may alternatively be used instead of tungsten.

According to the present embodiment, even if adjacent contact holes 7 are connected to each other via the upper portions thereof when the contact holes 7 is formed while manufacturing the semiconductor device 20, it is possible to prevent the plugs 9 filling the contact holes 7 from being short-circuited to each other. The method of the present embodiment is advantageous in manufacturing a semiconductor device in which the minimum width of the interlayer insulator film existing between two adjacent plugs is 0.30 µm or less, and provides significant effects in manufacturing a semiconductor device in which the wiring pitch of the wiring layer 2 is 0.50 µm or less.

Moreover, in the present embodiment, adjacent contact holes 7 can be separated from each other only by flattening the conductive material films 8 and 11 by a CMP method. Thus, the interlayer insulator film 3 is not flattened by a CMP method that is adjusted to conditions according to the conductive material films 8 and 11. Therefore, the method of the present embodiment is particularly suitable for cases where flattening the interlayer insulator film 3 by a CMP method that is adjusted to conditions according to the conductive material films 8 and 11 may cause problems. Furthermore, employing the two-layer structure including the conductive material films 8 and 11 and the interlayer insulator film 3 makes it easier to determine the end point of the CMP process.

While the conductive material films 8 and 11 may be of different materials, the same material is preferably employed for the conductive material films 8 and 11, in which case it is possible to employ the same CMP conditions (slurry species, etc.).

Embodiment 3

FIG. 3A to FIG. 3E are cross-sectional views and top views schematically illustrating a method for manufacturing a semiconductor device 30 of Embodiment 3 of the present invention, wherein the cross-sectional views of FIG. 3A, FIG. 3B, FIG. 3C and FIG. 3E are taken along lines α3—α3, β3—β3, γ3—γ3 and ε3—ε3, respectively, which are shown in the corresponding top views.

Figure 3A:
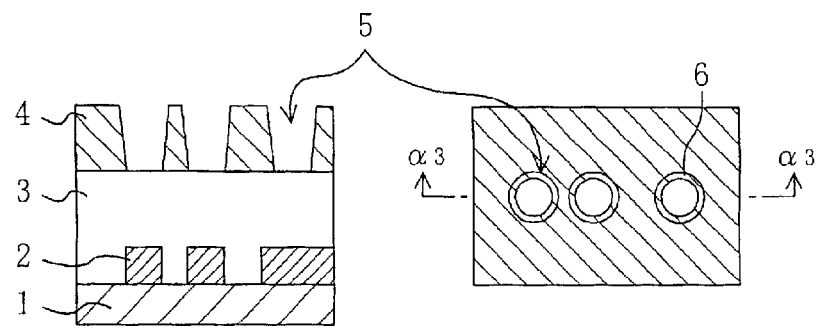
FIG. 3A to FIG. 3E are cross-sectional views and top views schematically illustrating a method for manufacturing a semiconductor device 30 of Embodiment 3 of the present invention, wherein the cross-sectional views of FIG. 3A, FIG. 3B, FIG. 3C and FIG. 3E are taken along lines α3—α3, β3—β3, γ3—γ3 and ε3—ε3, respectively, which are shown in the corresponding top views.
Figure 3B:
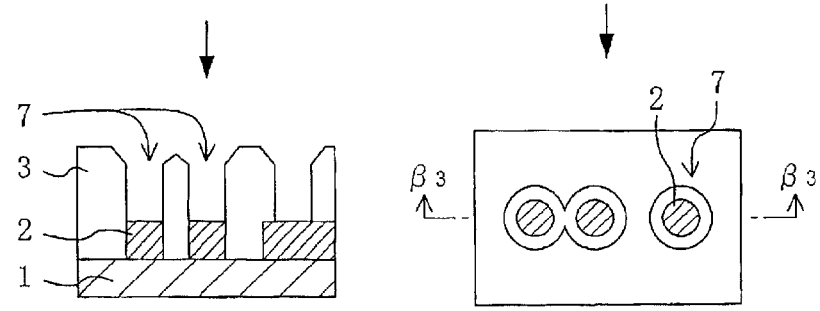

As illustrated in FIG. 3A and FIG. 3B, the method of the present embodiment is the same as that of Embodiment 1 up to the step of forming the contact holes 7 in the interlayer insulator film 3.

Figure 3C:
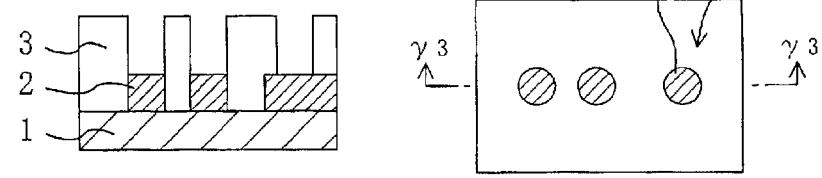

Then, in the step of FIG. 3C, an etchback process is performed on the entire surface of the substrate. In this process, the tapered upper portions of the contact holes 7 are removed. Thus, adjacent contact holes 7 can be separated from each other. While a CMP method is employed for the etchback process on the entire surface of the substrate in the present embodiment, the entire surface of the substrate may alternatively be etched by a plasma etching process instead of a CMP method. A CMP method is preferred particularly because the tapered upper portions can be removed effectively.

Figure 3D:

Then, in the step of FIG. 3D, the conductive material film 8 is deposited on the substrate.

Figure 3E:
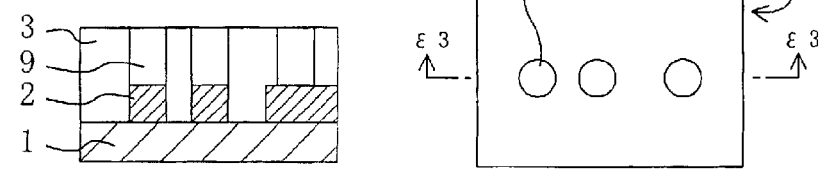

Then, in the step of FIG. 3E, the conductive material film 8 is flattened by a CMP method until the surface of the interlayer insulator film 3 is exposed, thus forming the plugs 9 which are made of the conductive material film 8 filling the contact holes 7.

The semiconductor device 30 is produced through these steps.

According to the present embodiment, the tapered upper portions of the contact holes 7 are removed by an etchback process using a CMP method, or the like, thereby separating adjacent contact holes 7 from each other, before depositing the conductive material film 8. Thus, it is possible to prevent the plugs 9 filling the contact holes 7 from being short-circuited to each other. The method of the present embodiment is advantageous in manufacturing a semiconductor device in which the minimum width of the interlayer insulator film existing between two adjacent plugs is 0.30 µm or less, and provides significant effects in manufacturing a semiconductor device in which the wiring pitch of the wiring layer 2 is 0.50 µm or less.

Particularly, in the present embodiment, a CMP method whose conditions are optimized for the interlayer insulator film 3 can be used in the etchback process, which is performed before depositing the conductive material film 8.

Moreover, the method for manufacturing a semiconductor device of the present embodiment is particularly suitable for cases where a material that is difficult to etch in a plasma etching process, e.g., copper, is used as the conductive material film.

In order to etch copper in a plasma etching process, it is typically necessary to increase the temperature of the substrate to be 200° C. or more, whereby it is difficult to perform the etching process with a method in which a resist film is used. Therefore, it is often the case that a film that undergoes little deformation to temperature (e.g., a hard mask such as an oxide film) is used instead of a resist film.

According to the present embodiment, however, there is no such problem because the plasma etching process is not performed.

Embodiment 4

FIG. 4A to FIG. 4F are cross-sectional views and top views schematically illustrating a method for manufacturing a semiconductor device 40 of Embodiment 4 of the present invention, wherein the cross-sectional views of FIG. 4A, FIG. 4B, FIG. 4C, FIG. 4D and FIG. 4F are taken along lines α4—α4, β4—β4, γ4—γ4, δ4—δ4 and ζ4—ζ4, respectively, which are shown in the corresponding top views.

As illustrated in FIG. 4A, the method of the present embodiment is the same as that of Embodiment 1 up to the step of forming the contact holes 7 in the interlayer insulator film 3.

Then, in the step of FIG. 4B, the resist film 4 is removed, and the substrate is washed. Then, an organic material film 12 (e.g., a resist film or an ARC (anti-reflective coating)) is formed so as to fill the contact holes 7.

Then, in the step of FIG. 4C, a portion of the interlayer insulator film 3 corresponding to the tapered upper portion of the contact hole 7 is removed by a CMP method. Thus, adjacent contact holes 7 are separated from each other. Then, the entire surface of the substrate is washed.

Then, in the step of FIG. 4D, the organic material film 12 is removed by a plasma etching process using a plasma having oxygen as its main component, or by using a solvent.

Figure 4E:
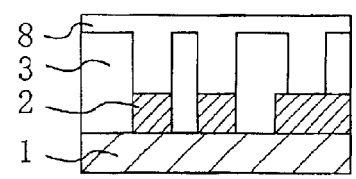

Then, in the step of FIG. 4E, the conductive material film 8 (e.g., polysilicon, a tungsten film, copper, etc.) is deposited on the substrate.

Then, in the step of FIG. 4F, the conductive material film 8 is flattened by a CMP method until the surface of the interlayer insulator film 3 is exposed, thus forming the plugs 9 which are made of the conductive material film 8 filling the contact holes 7.

The semiconductor device 40 is produced through these steps.

According to the present embodiment, the tapered upper portions of the contact holes 7 are removed by an etchback process using a CMP method, or the like, thereby separating adjacent contact holes 7 from each other, before depositing the conductive material film 8. Thus, it is possible to prevent the plugs 9 filling the contact holes 7 from being short-circuited to each other. The method of the present embodiment is advantageous in manufacturing a semiconductor device in which the minimum width of the interlayer insulator film existing between two adjacent plugs is 0.30 μm or less, and provides significant effects in manufacturing a semiconductor device in which the wiring pitch of the wiring layer 2 is 0.50 μm or less.

In a case where the tapered upper portions of the contact holes 7 are removed in an etchback process by a CMP method, or the like, with the contact hole 7 being open, a slurry may remain inside the contact holes 7 or a damage may be introduced due to the etchback process. Normally, a washing process is performed so as to remove the slurry. However, the removal of the slurry may be difficult when the contact hole 7 is a so-called "high aspect ratio" contact hole, where the ratio of the thickness of the interlayer insulator film 3 is high with respect to the diameter of the contact hole 7.

According to the present embodiment, a slurry used in a CMP method will not remain in the contact holes 7 because the contact holes 7 are filled with an organic material film. Thus, it is possible to suppress/prevent a slurry from existing, as an impurity, in a conductive material film when forming the plugs 9. Moreover, it is possible to suppress the damage due to an etchback process.

Embodiment 5

Figure 11A:
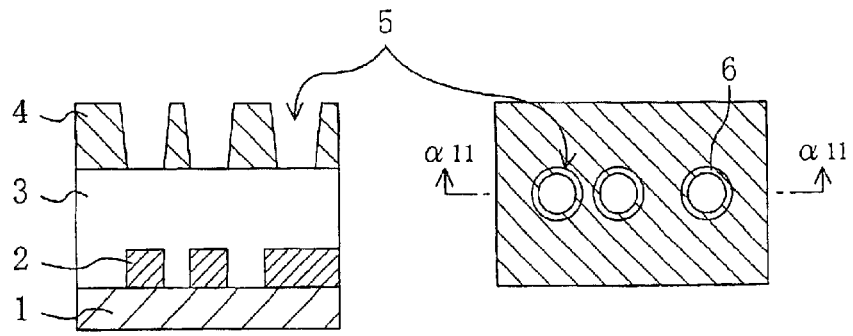
FIG. 11A to FIG. 11D are cross-sectional views and top views schematically illustrating a conventional method for manufacturing a semiconductor, wherein the cross-sectional views of FIG. 11A, FIG. 11B and FIG. 11D are taken along lines α11—α11, β11—β11 and δ11—δ11, respectively, which are shown in the corresponding top views.
Figure 11B:
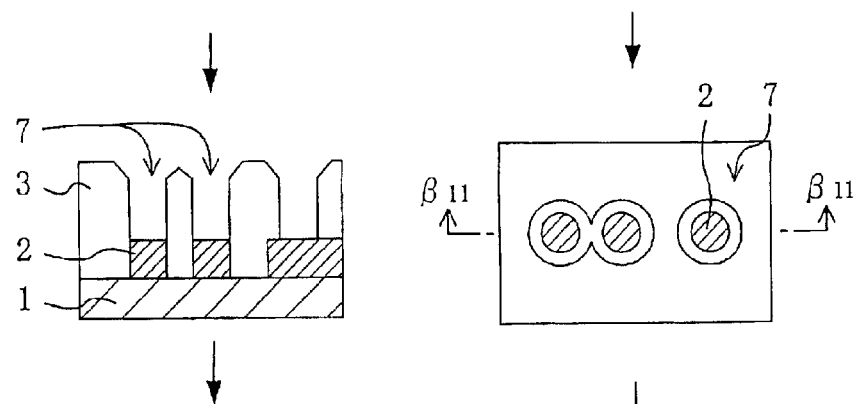
Figure 11C:
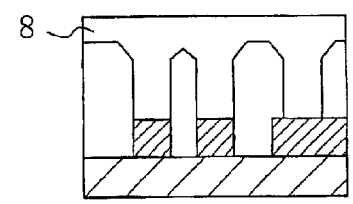
Figure 11D:
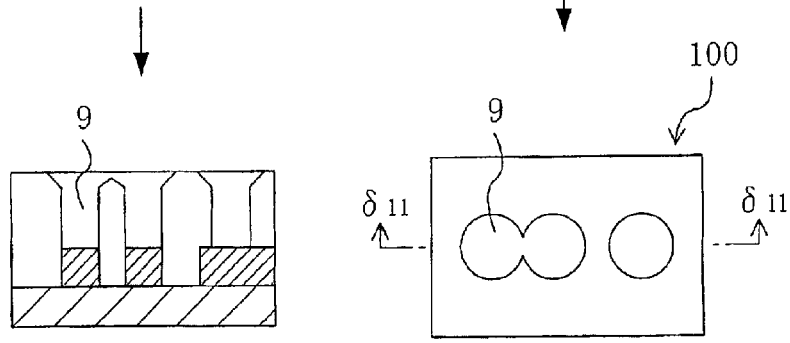

As described above, with a conventional method for manufacturing a semiconductor device, contact holes may be connected to each other via upper portions thereof. The possible cause of the problem will be further discussed below with reference to FIG. 6A to FIG. 6D. FIG. 6A to FIG. 6D schematically illustrate a part of the conventional manufacturing method from the step of FIG. 11A to the step of FIG. 11B.

Figure 6A:
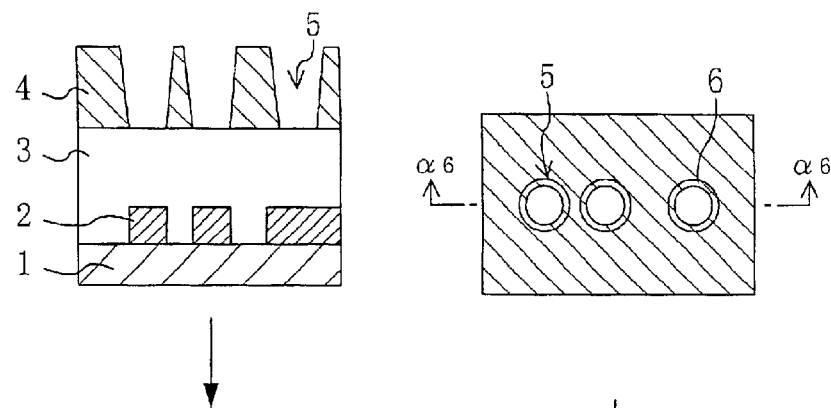
FIG. 6A to FIG. 6D are cross-sectional views and top views schematically illustrating a conventional method for manufacturing a semiconductor, wherein the cross-sectional views of FIG. 6A and FIG. 6D are taken along lines α6—α6 and δ6—δ6, respectively, which are shown in the corresponding top views.
Figure 6B:
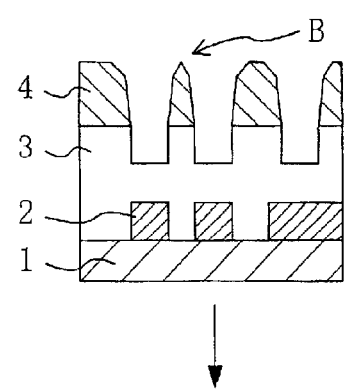
Figure 6C:
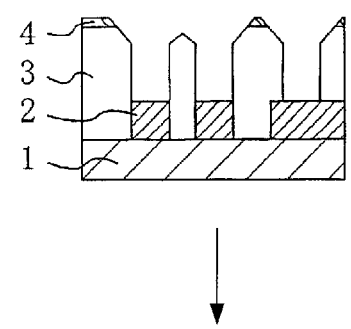
Figure 6D:
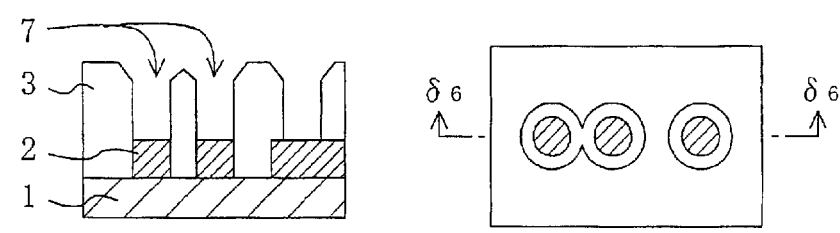

In a dry etching process in which the resist film 4 having the contact hole patterns 5 therein is used as an etching mask, as illustrated in FIG. 6A, the resist film 4 is also etched at the same time. Therefore, as the etching process proceeds, the thickness of the resist film 4 as a whole is reduced, and especially the contact hole patterns 5 are etched into a tapered shape, as illustrated in FIG. 6B. Thus, the contact hole patterns 5 may be connected to each other via the upper portions thereof at locations as that pointed by arrow B in FIG. 6B. AS the etching process further proceeds, the diameter of the contact hole pattern 5, being etched into a tapered shape, increases, as illustrated in FIG. 6C. As a result, an upper portion of the interlayer insulator film 3 located inside the contact hole pattern 5 is etched. Thus, a portion of the interlayer insulator film 3 that is not originally located in the contact hole pattern 5 is etched. Therefore, an upper portion of the contact hole 7 is tapered.

The small tapered portion in the upper portion of the contact hole 7 is enlarged in the following sputtering process using an inert gas (such as argon), which is performed before depositing the conductive material film 8. As a result, adjacent contact holes 7 may be connected via the upper portions thereof.

Figure 7:
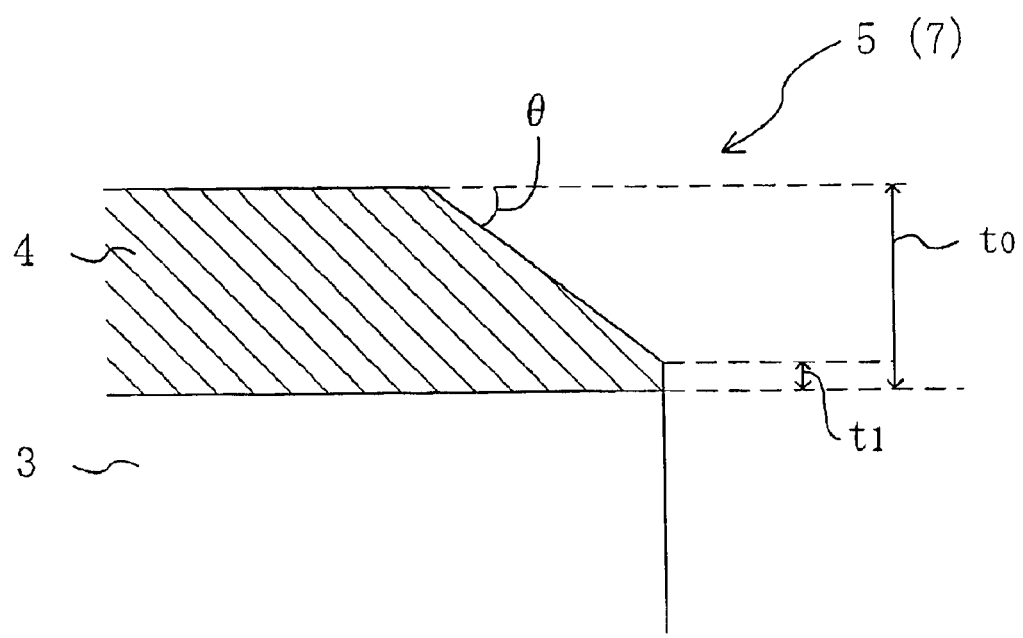
FIG. 7 is an enlarged view illustrating an upper portion of an contact hole pattern used for forming a contact hole, and the contact hole.

This phenomenon can be mathematically described as follows. Referring to FIG. 7, $t0$ denotes the initial thickness of the resist film 4, $t1$ denotes the thickness of a portion of the resist film 4 that forms the side wall 6, and $\theta$ denotes the taper angle of the tapered portion of the resist film 4. Then, $t1$ can be expressed by Expression (1) below:

$$t1 = t0 - RT/\cos\theta \qquad (1)$$

where R denotes the resist etch rate for a flat portion, and T denotes the etching time.

No tapered portion is formed if $t1 > tc$, where tc denotes the critical thickness of the resist film 4 for the formation of a tapered portion in an upper portion of the contact hole 7. Thus, $t0 - RT/\cos\theta > tc$. It has been experimentally found that tc has a value in the range of 150 to 200 nm. Therefore, when the resist film has a thickness of at least 150 nm, no tapered portion is formed in the upper portion of the contact hole 7. To be on the safe side, it is preferred that the thickness of the resist film is about 200 nm. Applying tc=200 nm to the above expression yields Expression (2) below:

$$(t0 - 200)\cos\theta > RT \qquad (2)$$

Thus, no tapered portion is formed in the upper portion of the contact hole 7 as long as Expression (2) is satisfied.

Expression (2) can be transformed into Expression (3) below:

$$s > L/((t0 - 200)\cos\theta) \qquad (3)$$

where s denotes the ratio (selectivity ratio) of the etch rate for the interlayer insulator film 3 with respect to the etch rate for the resist film 4, and L denotes the depth (etching depth) of a contact hole to be made by etching with respect to the surface of the interlayer insulator film 3.

Now, L is the total depth including the depth gained through over-etching (OE), and the value OE is normally 30% to 70% of the actual depth of the contact hole 7. Thus, L=La(1+OE/100), where La denotes the actual depth of the contact hole 7.

Figure 8:
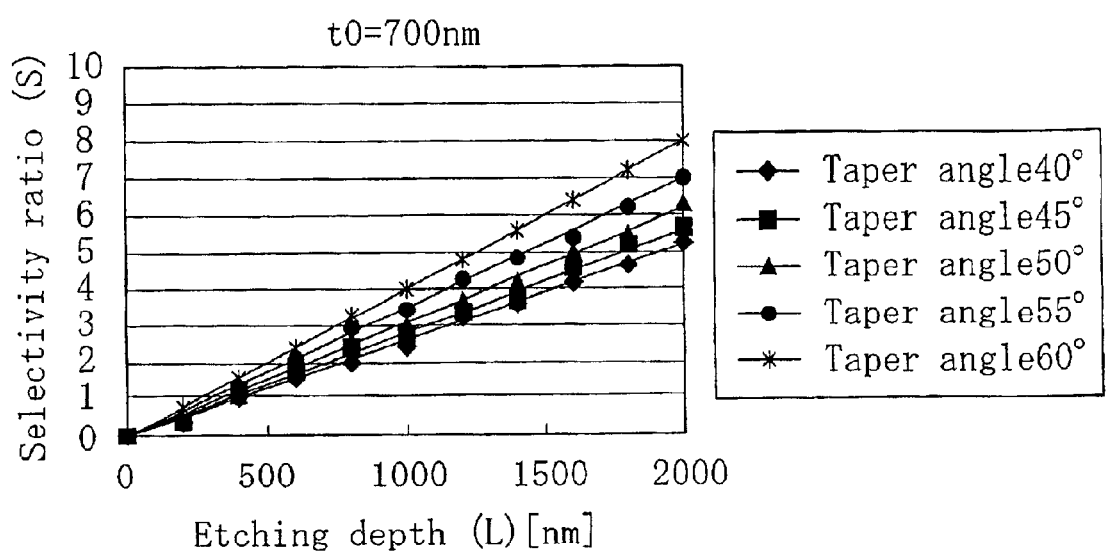
FIG. 8 is a graph illustrating required selectivity ratios for various etching depths in a case where the initial resist film thickness is 700 nm in Embodiment 5.
Figure 9:
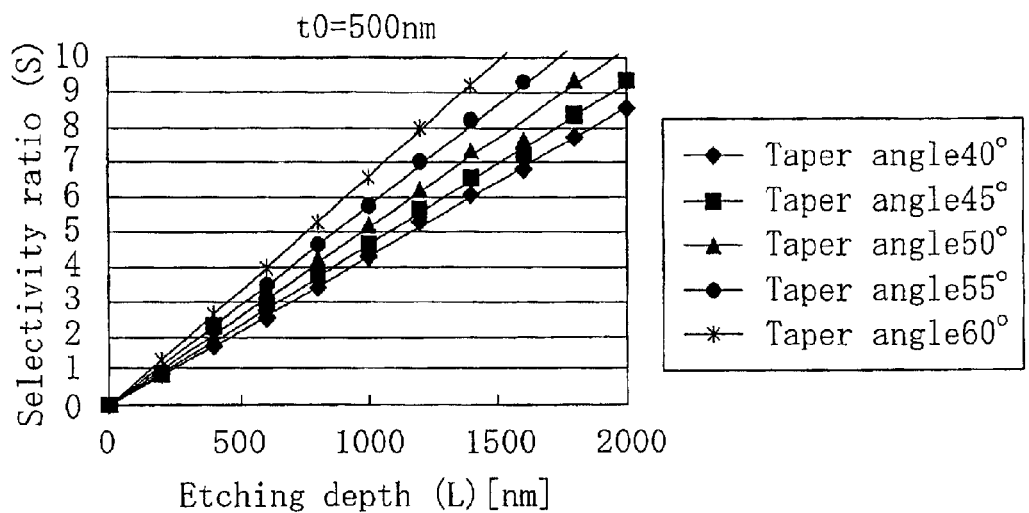
FIG. 9 is a graph illustrating required selectivity ratios for various etching depths in a case where the initial resist film thickness is 500 nm in Embodiment 5.
Figure 10:
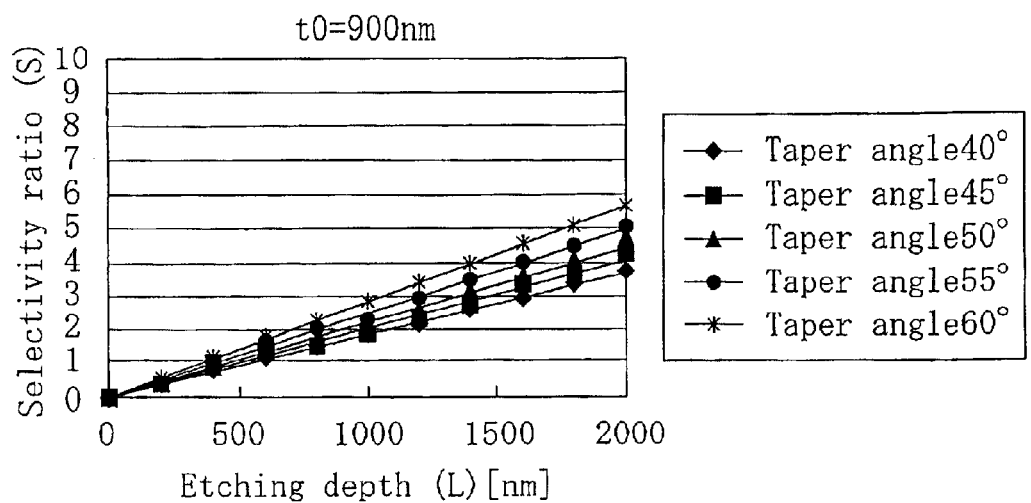
FIG. 10 is a graph illustrating required selectivity ratios for various etching depths in a case where the initial resist film thickness is 900 nm in Embodiment 5.

Using Expression (3) above, it is possible to obtain the selectivity ratio that is required for preventing a tapered portion from being formed in the upper portion of the contact hole 7. FIG. 8, FIG. 9 and FIG. 10 illustrate the calculation results for t0=700 nm, t0=500 nm and t0=900 nm, respectively. Note that θ is significantly dependent on the etching conditions, and increases as the ion energy is increased. The ion energy is equal to the self bias value and is also equal to about ½ of the peak-to-peak voltage of a high frequency power that is applied to a cathode of a dry etching apparatus.

As can be seen from the results shown in FIG. 8, FIG. 9 and FIG. 10, the contact hole 7 of a typical depth (about 500 nm) can be formed as long as the selectivity ratio s is 3.5 or more, in any of the cases.

The present embodiment is based on the above consideration. A method for manufacturing a semiconductor device of the present embodiment will now be described with reference to FIG. 5A to FIG. 5D.

Figure 5A:
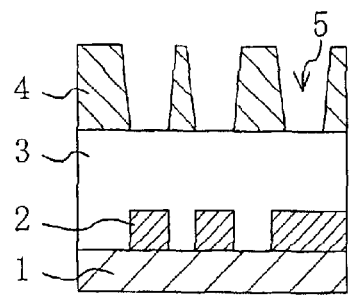
FIG. 5A to FIG. 5D are cross-sectional views and top views schematically illustrating a method for manufacturing a semiconductor device 50 of Embodiment 5 of the present invention, wherein the cross-sectional views of FIG. 5A and FIG. 5D are taken along lines α5—α5 and δ5—δ5, respectively, which are shown in the corresponding top views.
Figure 5A:
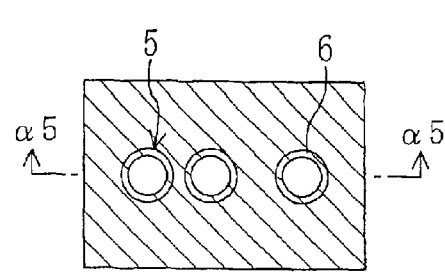
Figure 5B:
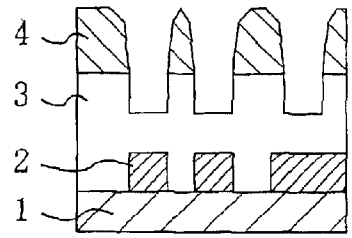
Figure 5C:
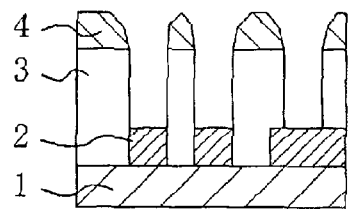
Figure 5D:
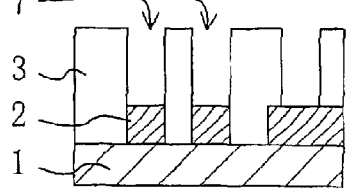
Figure 5D:
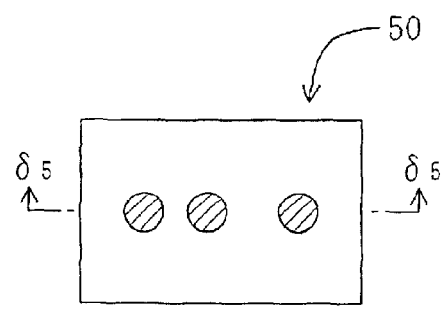

FIG. 5A to FIG. 5D are cross-sectional views and top views schematically illustrating a method for manufacturing a semiconductor device 50 of Embodiment 5 of the present invention, wherein the cross-sectional views of FIG. 5A and FIG. 5D are taken along lines α5—α5 and δ5—δ5, respectively, which are shown in the corresponding top views.

First, in the step of FIG. 5A, impurity diffusion regions (not shown) are formed in the semiconductor substrate 1 to form switching transistors (not shown), etc. Then, the wiring layer 2 is formed on the semiconductor substrate 1. In the present embodiment, the wiring pitch of the wiring layer 2 is 0.47 μm.

Then, the interlayer insulator film 3 is formed on the semiconductor substrate 1. In the present embodiment, an oxide film is used as the interlayer insulator film 3. Then, the interlayer insulator film 3 is flattened by using a CMP method. Then, the resist film 4 is formed so as to cover the interlayer insulator film 3. As described above, this process is performed so that the thickness of the resist film 4 satisfies Expression (2) above. Then, the contact hole patterns 5 are formed in the resist film 4 by photolithography. The contact hole patterns 5 are formed so that the side wall 6 of each contact hole pattern 5 is tapered downwardly.

Then, in the step of FIG. 5B, the interlayer insulator film 3 is dry-etched using the resist film 4 having the contact hole patterns 5 therein as an etching mask so as to form contact holes 7 reaching the wiring layer 2 or the impurity diffusion regions (not shown). The dry etching process is performed under conditions that satisfy Expression (3) above.

Then, in the step of FIG. 5C, the conductive material film 8 (e.g., polysilicon, a tungsten film, copper, etc.) is deposited on the substrate.

Then, in the step of FIG. 5D, the conductive material film 8 is flattened by a CMP method until the surface of the interlayer insulator film 3 is exposed, thus forming the plugs 9 which are made of the conductive material film 8 filling the contact holes 7.

The semiconductor device 50 is produced through these steps.

According to the present embodiment, adjacent contact holes are not connected to each other via upper portions thereof during the formation of the contact holes. The method of the present embodiment is advantageous in manufacturing a semiconductor device in which the minimum width of the interlayer insulator film existing between two adjacent plugs is 0.30 μm or less, and provides significant effects in manufacturing a semiconductor device in which the wiring pitch of the wiring layer 2 is 0.50 μm or less.

Particularly, in the present embodiment, the thickness of the resist film 4 and the etching conditions are adjusted so that adjacent contact holes are not connected to each other via upper portions thereof during the formation of the contact holes 7 by etching. In this way, it is possible to avoid an additional step of separating adjacent contact holes 7 that have been connected to each other via the upper portions thereof, which would otherwise be required before or after forming a conductive material film so as to fill the contact holes 7. Therefore, it is possible to suppress/prevent a short-circuit between plugs while reducing the manufacturing cost.

What is claimed is:

1. A method for manufacturing a semiconductor device, comprising the steps of:

(a) depositing an interlayer insulator film on a substrate including a plurality of conductive layers;

(b) forming a first contact hole, a second contact hole and a third contact hole running through the interlayer insulator film to reach respective ones of the plurality of conductive layers, each of the contact holes having a tapered portion at an upper end of the interlayer insulating film;

(c) depositing a conductive material film on the interlayer insulator film so as to fill the first contact hole, the second contact hole and the third contact hole;

(d) removing the conductive material film until a surface of the interlayer insulator film provided between the first contact hole and the second contact hole is exposed so as to separate the first contact hole and the second contact hole, and to form a first plug and a second plug both made of the conductive material film filling the first contact hole and the second contact hole, while the conductive material film connecting the second contact hole and the third contact hole is retained on the interlayer insulator film provided between the second contact hole and the third contact hole; and (e) removing the tapered portions so as to remove the conductive material film retained on the interlayer insulator film provided between the second contact hole and the third contact hole, and expose the interlayer insulator film provided between the second contact hole and the third contact hole, and separating an upper portion of the second contact hole and the third contact hole.

2. The method for manufacturing a semiconductor device of claim 1, wherein at the point of time when the step (b) is completed, the height of the interlayer insulator film provided between the second contact hole and the third contact hole is lower than the height of the interlayer insulator film provided between the first and the second contact hole.

* * * * *